(12) United States Patent
Ahlers et al.

(10) Patent No.: US 6,667,514 B2
(45) Date of Patent: Dec. 23, 2003

(54) SEMICONDUCTOR COMPONENT WITH A CHARGE COMPENSATION STRUCTURE AND ASSOCIATED FABRICATION

(75) Inventors: Dirk Ahlers, München (DE); Gerald Deboy, München (DE); Hans Weber, Ainring (DE); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/190,119

(22) Filed: Jul. 3, 2002

(65) Prior Publication Data
US 2003/0011039 A1 Jan. 16, 2003

(30) Foreign Application Priority Data
Jul. 3, 2001 (DE) .......................... 101 32 136

(51) Int. Cl.[7] .................. H01L 29/76; H01L 29/94; H01L 31/062; H01L 31/113; H01L 31/119
(52) U.S. Cl. .................. 257/336; 257/335; 257/341; 438/268
(58) Field of Search .............................. 257/335, 336, 257/337, 341

(56) References Cited

U.S. PATENT DOCUMENTS

| 4,754,310 | A | | 6/1988 | Coe |
| 5,216,275 | A | | 6/1993 | Chen |
| 6,291,856 | B1 | * | 9/2001 | Miyasaka et al. ........... 257/335 |
| 6,586,798 | B1 | * | 7/2003 | Frisina ........................ 257/328 |

FOREIGN PATENT DOCUMENTS

DE 199 50 579 A1 5/2001

* cited by examiner

*Primary Examiner*—Ngân V. Ngô
(74) *Attorney, Agent, or Firm*—Laurence A. Greenberg; Werner H. Stemer; Ralph E. Locher

(57) ABSTRACT

A semiconductor component includes a charge compensation structure wherein locations with a maximum local field strength are positioned in a compensation edge region of the charge compensation structure. Thus, an electrical parameter such as the on resistance of the semiconductor component can be substantially improved without influencing or impairing further parameters such as the breakdown voltage and the robustness with respect to TRAPATT oscillations. Methods of fabricating a semiconductor component with a charge compensation structure are also provided.

15 Claims, 9 Drawing Sheets

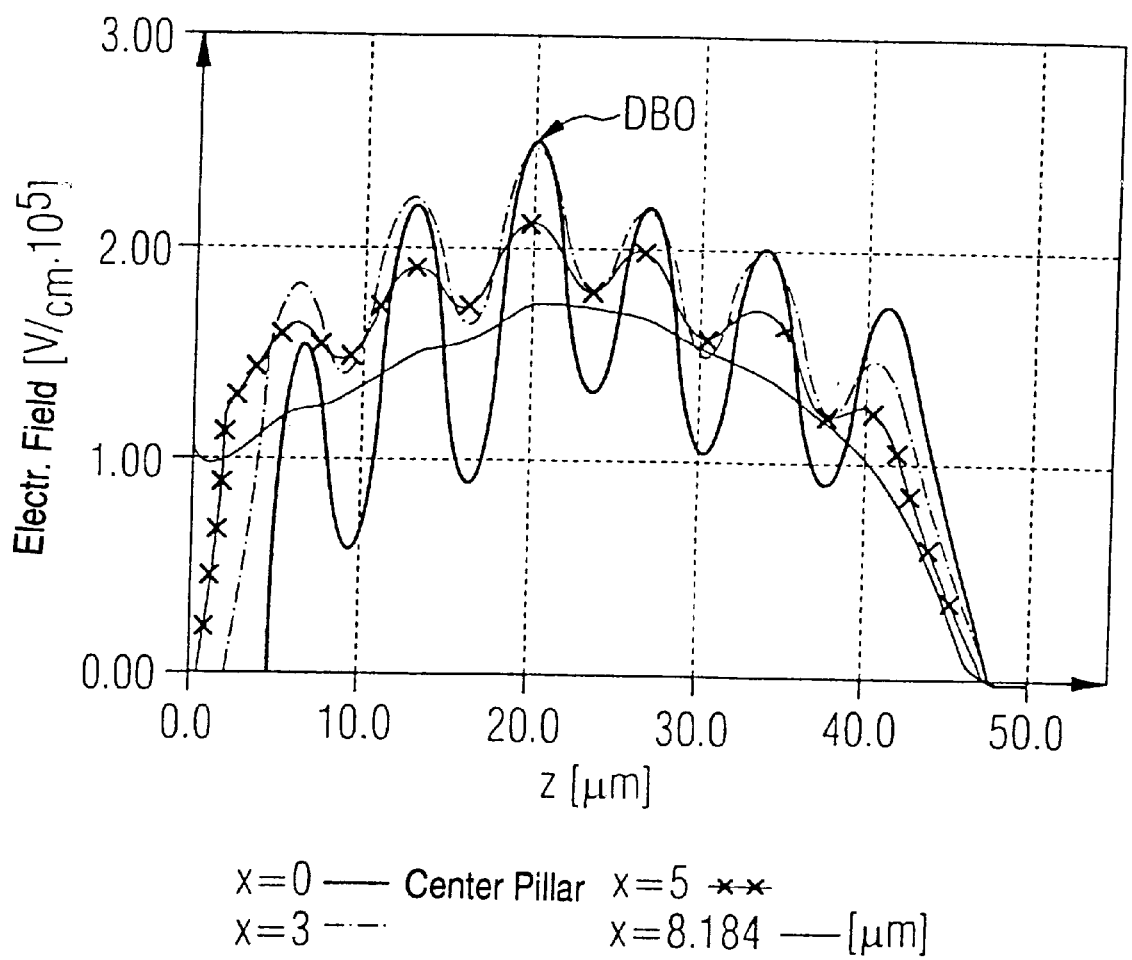

Disturbed Field Strength

Disturbed Net Doping

Doping "Elementary Cell"

Doping "Elementary Cell"

SEMICONDUCTOR COMPONENT WITH A CHARGE COMPENSATION STRUCTURE AND ASSOCIATED FABRICATION

BACKGROUND OF THE INVENTION

Field of the Invention

The present invention relates to a semiconductor component with a change compensation structure and associated fabrication methods and, in particular, to a compensation component which has improved properties for interacting parameters, such as the breakdown voltage, the on resistance, and the robustness with respect to TRAPATT oscillations (Trapped Plasma Avalanche Triggered Transit).

U.S. Pat. Nos. 4,754,310 and 5,216,275 disclose theoretical investigations for semiconductor components with charge compensation structures with the object of improving the on resistance and robustness with regard to the avalanche breakdown and a short circuit in the high-current case with a high source-drain voltage.

The compensation principle of semiconductor components with charge compensation structure is essentially based on a reciprocal compensation of charges in n-doped and p-doped regions in the drift region of a transistor. In this case, the regions are spatially arranged such that the path integral over the doping along, for example, a line running vertically to the pn junction in each case remains below the material-specific breakdown charge (approximately $3 \times 10^{12}$ $cm^{-2}$ for silicon). By way of example, p-type and n-type pillars or plates or compensation regions may be arranged in pairs in a vertical transistor of the kind that is customary in power electronics.

By virtue of the extensive compensation of the p- and n-type dopings, the doping of the current-carrying region can be significantly increased in compensation components, which results in a significant gain in on resistance despite the loss of current-carrying area. In this case, the blocking capability of the transistor essentially depends on the difference between the two effective dopings. Since it is desirable for the current-carrying region to have a doping which is higher by at least one order of magnitude, for reasons of reducing the on resistance, controlling the reverse voltage requires controlled setting of the degree of compensation, which can be defined for values in the range $\leq \pm 10\%$. This range becomes even smaller in the case of a higher gain of the on resistance. In this case, the degree of compensation can be defined by:

2*(p-type doping−n-type doping)/(p-type doping+n-type doping)

or by

2*charge difference/charge of the doping regions.

FIG. 1 shows a simplified partial sectional view of a compensation component according to the prior art.

In accordance with FIG. 1, a plurality of semiconductor layers are situated on a carrier substrate or in a second zone 1, which is preferably n$^+$-doped, which layers together form first compensation regions 2 of a first conductivity type (e.g. n). In this case, the charge compensation structure of the compensation component includes a plurality of compensation zones for forming a pillar-type second compensation region 3, which is connected to a source electrode or first electrode layer S via a pn-forming zone 7 or an associated zone 7' of the second conductivity type (p$^+$, p$^{++}$) and a first zone 6 of the first conductivity type (n$^+$). In this case, a drain electrode D is connected to the second zone 1. A control layer or gate electrode G formed at the surface thus realizes, together with the source and drain electrodes, a field-effect transistor. In order to insulate the gate electrode G, in accordance with FIG. 1, a first insulation layer Is1 or gate oxide layer is formed on the semiconductor material and a second insulation layer or an intermediate oxide Is2 is formed toward the source electrode.

In compensation components, in the charge compensation structure below the actual field-effect transistor, p- and n-type regions are arranged next to one another or nested in one another in such a way that, in the off-state situation, their charges can be reciprocally depleted and that, in the turned-on state, there is a non-interrupted low-resistance conduction path from the source electrode S to a drain electrode or the second electrode layer D which is connected to the second zone 1. For reasons of clarity, at this point reference is made to the description of semiconductor components with a charge compensation structure in, for example, German Patent No. DE 198 400 32 C1.

FIG. 2 shows a simplified sectional view for illustrating a fabricating step of the compensation component in accordance with FIG. 1. Identical reference symbols designating identical or corresponding layers or elements.

In accordance with FIG. 2, on an n$^+$-doped carrier substrate or the second zone 1, a first semiconductor layer E1 and a second semiconductor layer E2 have already been deposited epitaxially for the purpose of forming the first compensation regions 2, compensation zones 4 already being situated at the interfaces between the first and second semiconductor layers E1 and E2. Accordingly, in order to realize the charge compensation structure illustrated in FIG. 1, firstly a carrier substrate 1 is provided and then a plurality of semiconductor layers E1 to Ex are formed epitaxially, for example, a plurality of compensation zones 4 being formed at the surface of the respective epitaxial layers using a respective mask 5.

Preferably, the volume to be patterned is firstly doped homogeneously with one type of charge, for example with donors (background doping). Afterward, the mask 5 is applied, for example as photoresist, and patterned in such a way that openings are produced at suitable locations. At the locations of the openings, acceptors, for example, are then introduced into the second semiconductor layer E2 for example through the use of ion implantation or conventional doping from the gas/solid phase, as a result of which firstly relatively narrowly bounded compensation zones 4 are produced at the surface. In this case, a part of this dopant concentration is not electrically active, since it is intrinsically compensated by the background doping. This part must accordingly be kept in order to obtain a desired electrically active doping.

The operation illustrated in FIG. 2 is repeated until a sufficiently thick n-multi-epitaxial layer with incorporated compensation zones 4 that are aligned with respect to one another and are stacked one above the other is present. In a subsequent step, the compensation zones 4 fabricated in this way can be outdiffused (as it were inflated) in such a way as to produce the pillar-type structure of the second compensation region 3 as illustrated in FIG. 1. This outdiffusion is preferably produced during the formation of the zones 7 and 7' forming the pn junction, the first zone 6, the first insulating layer Is1 (gate oxide layer), the control electrode layer G, the second insulating layer Is2 (intermediate oxide) and also the first electrode layer S. In contrast to conventional devices or semiconductor components, the breakdown location of (power) semiconductor components with charge compensation structure in accordance with FIG. 1 does not lie near the surface, but rather preferably (for robustness reasons) deep in the voltage-accepting drift volume or semiconductor substrate E1 to Ex or 1. In the case of this construction, however, under unfavorable switching conditions extreme oscillation phenomena can arise which can destroy the semiconductor component or else the circuitry. Such a case can occur for MOS transistors with breakdown deep in the drift volume for example in the event of so-called avalanche breakdown:

In this case, firstly the MOS field-effect transistor is in the turned-on state and a very high channel current (of the order of magnitude of the rated current) is impressed via an inductance of, for example, external circuitry. If the transistor is then switched off, the inductance continues to draw current from the device, but this current is now no longer supplied as channel current, but as displacement current. As a result, the volume of the semiconductor substrate is depleted of mobile charges (space charge zone, depletion zone) and an electric voltage builds up between the first electrode (source S) and the second electrode (drain D).

As soon as the breakdown voltage is exceeded, electron/hole pairs are generated at the breakdown location and are separated on account of the high electric field and flow away in the direction of the respective electrodes S and D. An avalanche current thus arises. However, since the breakdown takes place deep in the drift volume or semiconductor substrate E1 to Ex or 1, the resulting charge packets or charge carriers L require a relative long propagation time through to the space charge boundary. Only when they have arrived there does their effect have a significant influence on the external circuitry. During this propagation time, however, the induction coil continues to draw displacement current from the device, so that the voltage present and thus also the generation rate of the avalanche charge (avalanche charges) increases more than proportionally. The voltage dips only when the charge packets arrive at the space charge boundary. From this point in time, however, an excessively high current will now flow away via the coil, resulting in a falling source/drain voltage (=negative differential resistance). On account of the decreasing voltage, however, the current generation rate decreases in the breakdown location, but this in turn does not influence the external circuitry immediately but rather only in a temporally offset manner. The above-described operation is continued analogously. A current-voltage oscillation is thus started, which is known as so-called TRAPATT oscillation, and which, under unfavorable circumstances, even begins to escalate above a predetermined threshold current. In this case, the current density can rise (locally) so high that the semiconductor component or external circuitry is destroyed.

In this case, the above-described TRAPATT mechanism (Trapped Plasma Avalanche Triggered Transit) proceeds more unfavorably, the higher the charge carrier generation in the semiconductor component. Only a simplified case has been presented in the explanatory model described above. In reality, however, in addition to the charge carriers L which arise at the breakdown location (first-order ionization), electrons and holes may also be generated at another location through impact ionization (second-order ionization).

This charge carrier generation results essentially when charge carriers L which define a current density j pass into a region where a high electric field $E_A$ prevails. This impact ionization $I_s$ is proportional to $j*\exp(-\text{const.}/E_A)$.

For compensation components (such as e.g. compensation modules sold under the trademark "COOLMOS") which are produced according to currently proven methods (multiple epitaxy), a situation is accordingly present wherein precisely this impact ionization or second-order ionization is formed in an extreme manner.

FIG. 3 shows a simplified graphical illustration of an electric field strength profile as a function of different distances from a center axis of the second compensation region 3. It becomes clear from FIG. 3 that the highest field strength fluctuations essentially lie in the center of a respective pillar or a second compensation region 3. In this case, FIG. 3 essentially represents a depth-resolved profile of an electric field at various sectional positions within a cell for a "COOLMOS" product, the number of layers differing from the structure illustrated in FIG. 1.

As is evident from FIG. 3, the highest field strengths of the semiconductor component lie in or near the center of the p-type pillar (n-type pillar) or of the second compensation region 3. It is precisely there, however, that the holes (electrons) L generated in the breakdown are focused, as it were, if they flow away from a deep breakdown location for example in the direction of the first electrode S (source). In this case, the equipotential lines act like a converging lens for the charge carriers L, whereby splitting, as it were, is generated. Since very high current densities are thus accompanied by very high field maxima in the center of the pillar or of the second compensation region 3, the above-described secondary ionization supplies a substantial proportion of the entire avalanche breakdown current, as a result of which the TRAPATT oscillation is amplified or even caused in the first place.

In order to increase the robustness with respect to TRAPATT oscillations, field strength peaks (primarily in a charge carrier path prescribed in the breakdown situation) must be reduced (e.g. through changes in the depth-resolved charge balance of the drift volume). However, this generally reduces the breakdown voltage. This effect can be lessened or eliminated by greater outdiffusion of the compensation zones 4 (e.g. FIG. 2). As a result, however, the n-conducting current path is then constricted again, that is to say the on resistance is impaired and the TRAPATT susceptibility is slightly increased. This cause-and-effect chain shows that the set of parameters (breakdown voltage, robustness with respect to TRAPATT oscillations and on resistance) is closely coupled to one another. Improving one of these parameters generally impairs at least one of the other two parameters with previously known methods.

SUMMARY OF THE INVENTION

It is accordingly an object of the invention to provide a semiconductor component with a charge compensation structure and associated fabrication methods which overcome the above-mentioned disadvantages of the heretofore-known semiconductor components and fabrication methods of this general type and which provide improved electrical properties. In particular, the invention is intended to reliably achieve improvement of one parameter, such as e.g. a high breakdown voltage, without, as usual, realizing this improvement at the expense of other parameters such as e.g. an optimized on resistance and/or a high robustness with respect to TRAPATT oscillations.

With the foregoing and other objects in view there is provided, in accordance with the invention, a semiconductor component, including:

a semiconductor substrate;

a first electrode layer;

a second electrode layer;

a charge compensation structure having a blocking pn junction in the semiconductor substrate, a first zone of a first conductivity type connected to the first electrode layer, a zone of a second conductivity type opposite to the first conductivity type connected to the first electrode layer and adjoining the first zone of the first conductivity type for forming a blocking pn junction, a second zone of the first conductivity type connected to the second electrode layer, a first compensation region of the first conductivity type and a second compensation region of the second conductivity type nested into one another in a region between the first zone of the first conductivity type and the second zone of the first conductivity type;

the first compensation region and the second compensation region forming a pn junction therebetween, the pn junction between the first compensation region and the second compensation region defining a compensation edge region; and the first compensation region, the second compensation region and the compensation edge region being configured such that locations with a maximum local field strength are situated in the compensation edge region.

In other words, a semiconductor component with a charge compensation structure, which has a blocking pn junction in a semiconductor substrate, having a first zone of a first conductivity type, which is connected to a first electrode layer and adjoins a zone—forming the blocking pn junction of a second conductivity type opposite to the first conductivity type, which is likewise connected to the first electrode layer, and having a second zone of the first conductivity type, which is connected to a second electrode layer, a first compensation region of the first conductivity type and a second compensation region of the second conductivity type being nested or interleaved in one another in the region between the first zone and the second zone, and the pn junction between the first and second compensation regions defining a compensation edge region, wherein locations with maximum local field strength are located in the compensation edge region.

In particular by forming a doping such that locations with locally maximum field strength are displaced into a compensation edge region, it is possible to substantially improve one parameter, e.g. the on resistance of the compensation component, without influencing or impairing the other parameters, e.g. breakdown voltage and robustness with respect to TRAPATT oscillations.

In particular by setting a ratio $V=E_{tr,max}/E_{v,max}>1$, where $E_{tr}$ represents a lateral and $E_v$ a vertical field strength and 'max' in each case denotes a corresponding field strength peak, it is possible to shift the locations of maximum field strengths (field strength peaks) completely into the edge region.

According to another feature of the invention, the first and second compensation regions haven increased dopant concentrations selected such that a lateral field strength is increased without changing a charge compensation capability.

In order to increase the lateral field strength, it is possible, for example, to significantly increase a dopant concentration in the first and second compensation regions (for example the increase may amount to approximately 10% compared with known devices), i.e. usually approximately $1\times10^{14}$ to $10\times10^{16}$ cm$^{-3}$, as a result of which, in an advantageous manner, the resistance of the conducting path is reduced without influencing the breakdown voltage or the TRAPATT susceptibility.

According to another feature of the invention, the first and second compensation regions have an reduced doping ripple selected such that the doping ripple is reduced in order to reduce a vertical field strength.

According to another feature of the invention, the second compensation region has an increased number of compensation zones in the vertical direction for reducing the doping ripple.

According to another feature of the invention, the semiconductor substrate has an increased number of epitaxial layers for reducing the doping ripple.

According to another feature of the invention, the charge compensation structure has a hexagonal shape or a strip shape when viewed in a plan view.

According to another feature of the invention, the semiconductor component is a compensation component.

In order to reduce a vertical field strength, it is possible to reduce a ripple of the first and second compensation regions, thereby again producing improved TRAPATT properties. A reduced doping ripple can be realized for example through the use of an increased number of compensation zones and, in particular, through the use of an increased number of epitaxial layers in the semiconductor substrate.

With the objects of the invention in view there is also provided, a method for fabricating a semiconductor component according to the invention, the method includes the steps of:

providing a carrier substrate;

forming a plurality of semiconductor layers in order to realize the first compensation region;

carrying out a masked doping at least in a part of the semiconductor layers in order to form compensation zones and in order to realize the second compensation region nested in the first compensation region;, carrying out an unmasked doping with a conductivity type opposite to a conductivity type of the masked doping, in at least one of the semiconductor layers, in order to shift the locations with the maximum local field strength into the compensation edge region; and forming elements and layers for driving the first and second compensation regions.

A preferred mode of the method according to the invention includes introducing boron as a dopant for the masked doping and introducing phosphorus as a dopant for the unmasked doping.

With the objects of the invention in view there is also provided, a method for fabricating a semiconductor component according to the invention, the method includes the steps of:

providing a carrier substrate of the first conductivity type in order to realize the first compensation region;

forming a trench in the carrier substrate;

filling the trench with a semiconductor material of the second conductivity type in order to form the second compensation region; and forming elements and layers which drive the first and second compensation regions.

A preferred mode of the method according to the invention includes forming the trench by using an anisotropic etching method.

With regard to the fabrication method, a semiconductor component with improved TRAPATT properties can be fabricated in a particularly simple and cost-effective manner in particular by formation of a plurality of semiconductor layers with a respective masked doping in order to form compensation zones or in order to realize the second compensation regions and at least one unmasked doping of the opposite conductivity type in order to displace the breakdown locations into the compensation edge region.

Preferably, for the masked and the unmasked doping, dopants of the opposite conductivity type that diffuse essentially equally rapidly are introduced through the use of ion implantation, as a result of which the fabrication method can be simplified further. A respective implantation energy is selected in such a way that the implantation maxima of the introduced dopants essentially lie at the same depth (in which case, of course, even in the event of additional whole-area implantation, the compensation conditions must be preserved, that is to say that the corresponding charge must be taken into account, i.e. must be kept in the masked implantation).

As an alternative, however, it is also possible to form a trench in a carrier substrate and to fill the trench with a semiconductor material of the opposite conductivity type to the carrier substrate, as a result of which a doping ripple can be completely eliminated and, accordingly, the breakdown locations are located precisely at the pn junction between the first and second compensation regions. In the case of a semiconductor component fabricated according to a method of this type, essentially a symmetrization of a hole path to an electron path is obtained, as a result of which the TRAPATT properties are improved further.

Other features which are considered as characteristic for the invention are set forth in the appended claims.

Although the invention is illustrated and described herein as embodied in a semiconductor component with charge compensation structure and associated fabrication methods, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION IF THE DRAWINGS

FIG. 3 is a simplified graphical representation of a depth-resolved field strength profile in accordance with the prior art;

DESCRIPTION OF THE PREFERRED EMBODIMENTS

In order to illustrate the relationships essential to the present invention, firstly the field strengths that occur in a charge compensation structure will be described in detail.

Figure 4C:
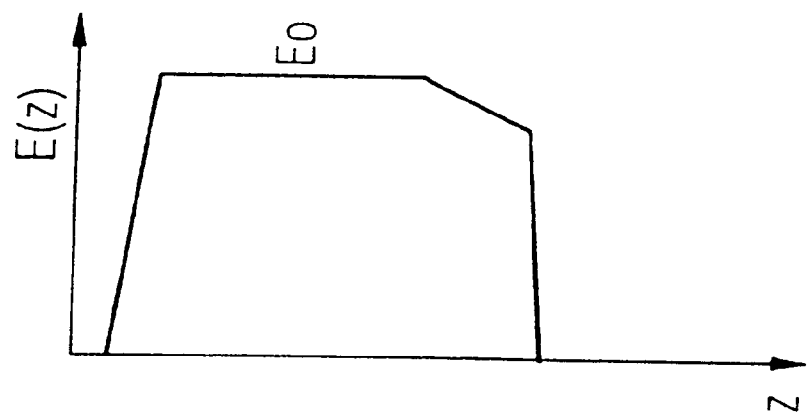
FIG. 4C is a simplified graphical representation of an electric field strength of an elementary cell of the charge compensation structure for illustrating a homogeneous field strength.
Figure 4B:
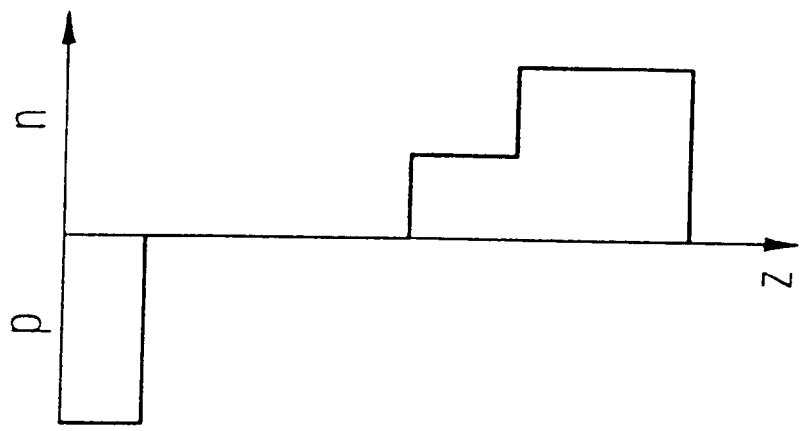
FIG. 4B is a simplified graphical representation of a net doping of an elementary cell of the charge compensation structure for illustrating a homogeneous field strength.
Figure 4A:
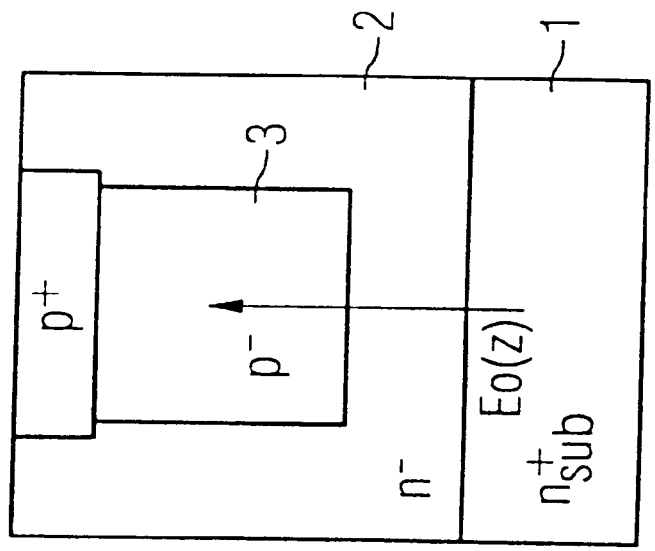
FIG. 4A is a simplified sectional view of an elementary cell of the charge compensation structure for illustrating a homogeneous field strength.

FIG. 4A shows a simplified sectional view of an elementary cell of the charge compensation structure, based firstly on a homogeneously distributed second compensation region 3 which is situated in a first or between two compensation regions 2. The semiconductor substrate 1 is $n^+$-doped, for example, for which reason the first compensation regions 2 have an $n^-$-type doping and the second compensation region 3 has a $p^-$-type doping and has a $p^+$-type doping for example in its region near the surface.

A net doping associated with FIG. 4A is illustrated in FIG. 4B. Such a homogeneous dopant distribution in the second compensation region 3 results in an essentially homogeneous field strength $E_0$, which would essentially be established if the charge balance in each horizontal plane of the pillar-permeated volume were constant, that is to say equal to zero in the example illustrated. The consequence is a quasi one-dimensional field strength, which is illustrated in FIG. 4C.

Figure 5C:
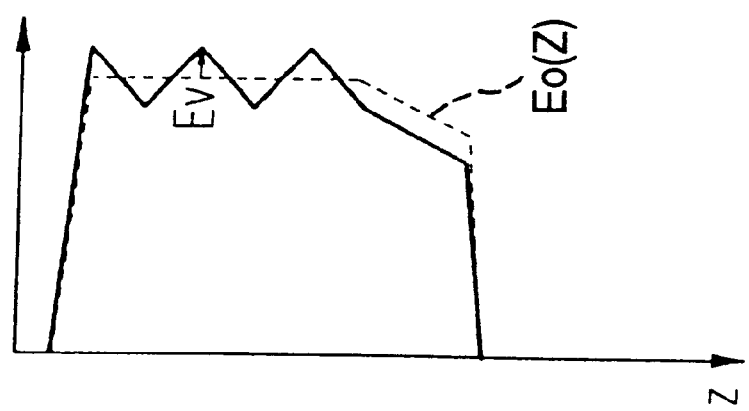
FIG. 5C is a simplified graphical representation of an electric field strength of an elementary cell of the charge compensation structure for illustrating a vertical field strength.
Figure 5B:
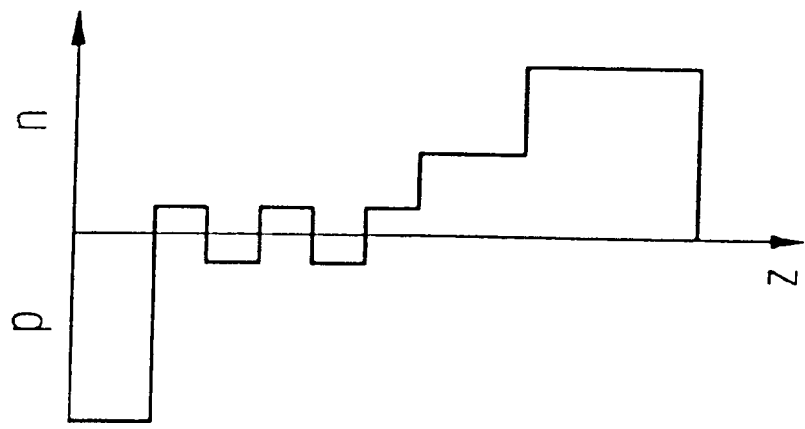
FIG. 5B is a simplified graphical representation of a net doping of an elementary cell of the charge compensation structure for illustrating a vertical field strength.
Figure 5A:
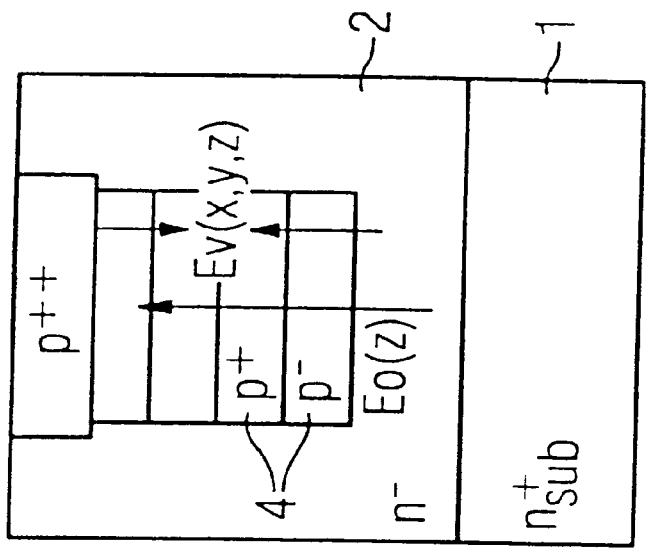
FIG. 5A is a simplified sectional view of an elementary cell of the charge compensation structure for illustrating a vertical field strength.

FIG. 5A now shows a simplified sectional view of an elementary cell of the charge compensation structure with vertical inhomogeneities, as are usually caused by the plurality of compensation zones 4. Identical reference symbols again designate identical or similar layers or elements, for which reason a detailed description is dispensed with below.

In accordance with FIG. 5A, the second compensation region 3 now includes a plurality of compensation zones 4 with different degrees of doping ($p^-$, $p^+$). An associated disturbed net doping (=charge balance of a horizontal plane) is illustrated in FIG. 4B. The influence of the vertical inhomogeneity in the z direction within the second compensation region 3 can be described through the use of a vertically directed disturbance field $E_v$ which is superposed on the above-described quasi one-dimensional, likewise vertically directed, homogeneous field $E_0$.

FIG. 5C shows a simplified illustration of the disturbed field strength which results from this superposition of the field strengths $E_0$ and $E_v$.

Figure 6:
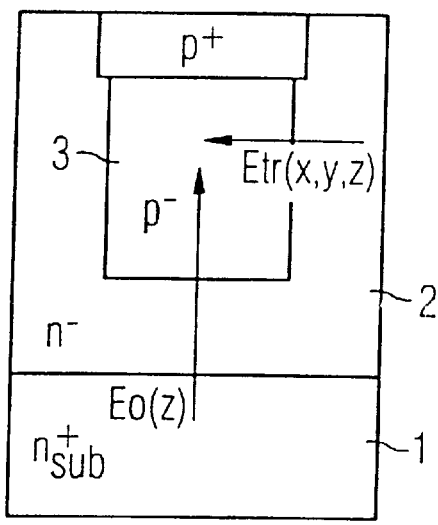
FIG. 6 is a simplified sectional view of an elementary cell of the charge compensation structure for illustrating a lateral field strength.

Furthermore, FIG. 6 shows a simplified sectional view of an elementary cell of the charge compensation structure for illustrating a lateral or transverse field $E_{tr}$, identical reference symbols again designating identical or similar layers and a repeated description being dispensed with below.

In accordance with FIG. 6, in addition to the above-described vertical fields or the vertical field strength $E_v$, a lateral field or lateral field strength $E_{tr}$ is also produced, which is likewise superposed on the quasi one-dimensional field $E_0$ and the vertical field $E_v$. This lateral field $E_{tr}$ essentially results from the reciprocal depletion of the charges in the compensation regions arranged laterally or in the compensation direction.

Figure 7:
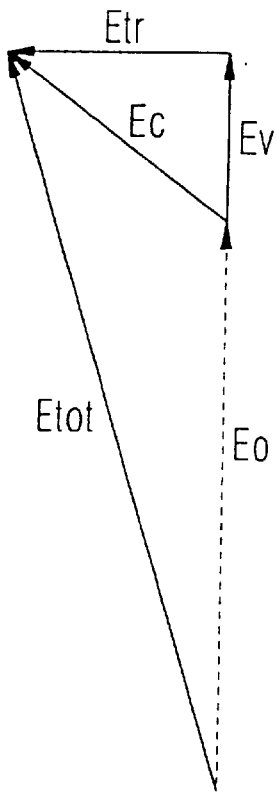
FIG. 7 is a vector diagram of the electric field strengths occurring in the charge compensation structure.

FIG. 7 shows a vector diagram of the field strengths described in FIGS. 4 to 6, a total field strength $E_{tot}$ resulting as the sum of the field strengths $E_0$, $E_{tr}$ and $E_v$. $E_c$ now designates a compensation field strength in the edge structure, which essentially results from the vertical field strength $E_v$ and the lateral field strength $E_{tr}$. Accordingly, the following holds true:

$$\overline{E}_{tot} = \overline{E}_0 + \overline{E}_c,$$

where $$\overline{E}_c = \overline{E}_{tr} + \overline{E}_v$$

On the basis of these insights, a semiconductor component is now provided in which locations with maximum field strength are located outside a region of the second compensation region near the center, as a result of which the ensemble or the totality of the parameters (breakdown voltage/on resistance/robustness with respect to TRAPATT oscillations) can be reliably improved.

Figure 1:
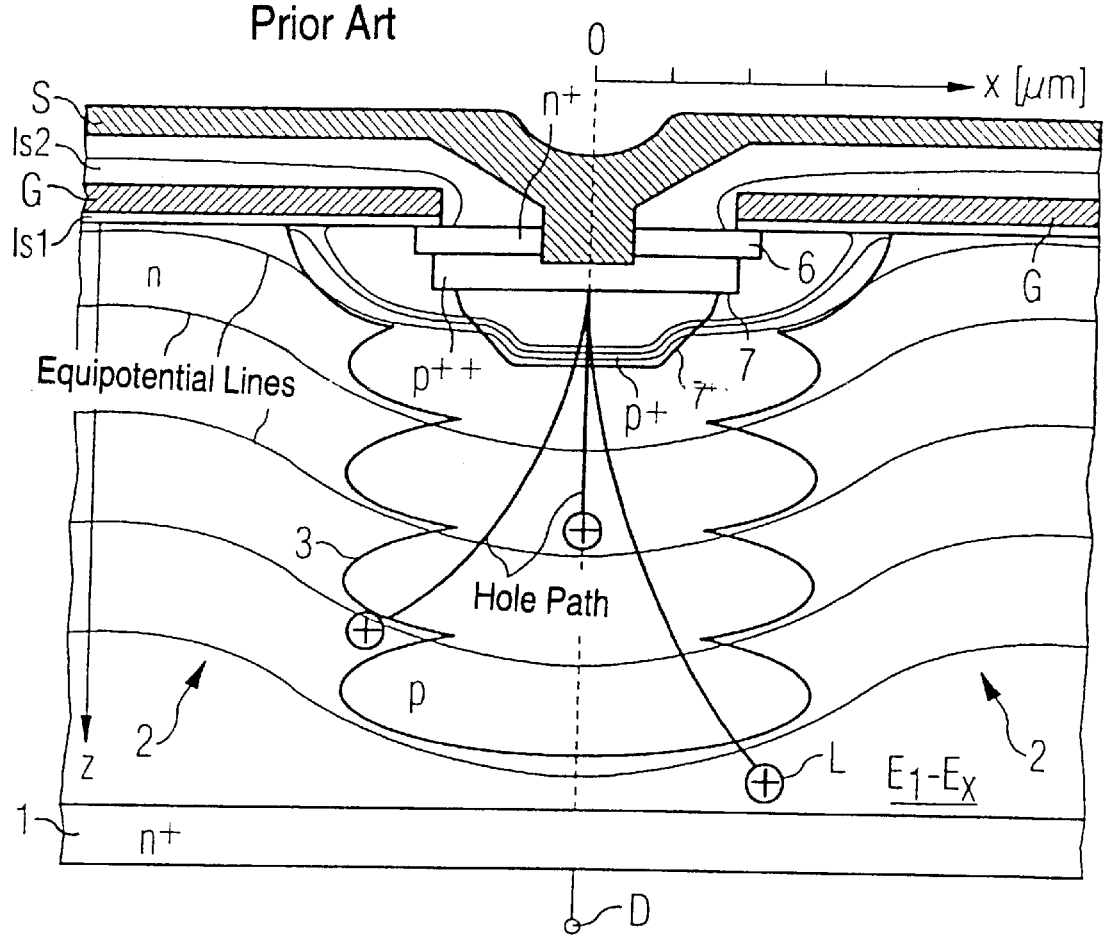
FIG. 1 is a diagrammatic partial sectional view of a semiconductor component with a conventional charge compensation structure.
Figure 8A:
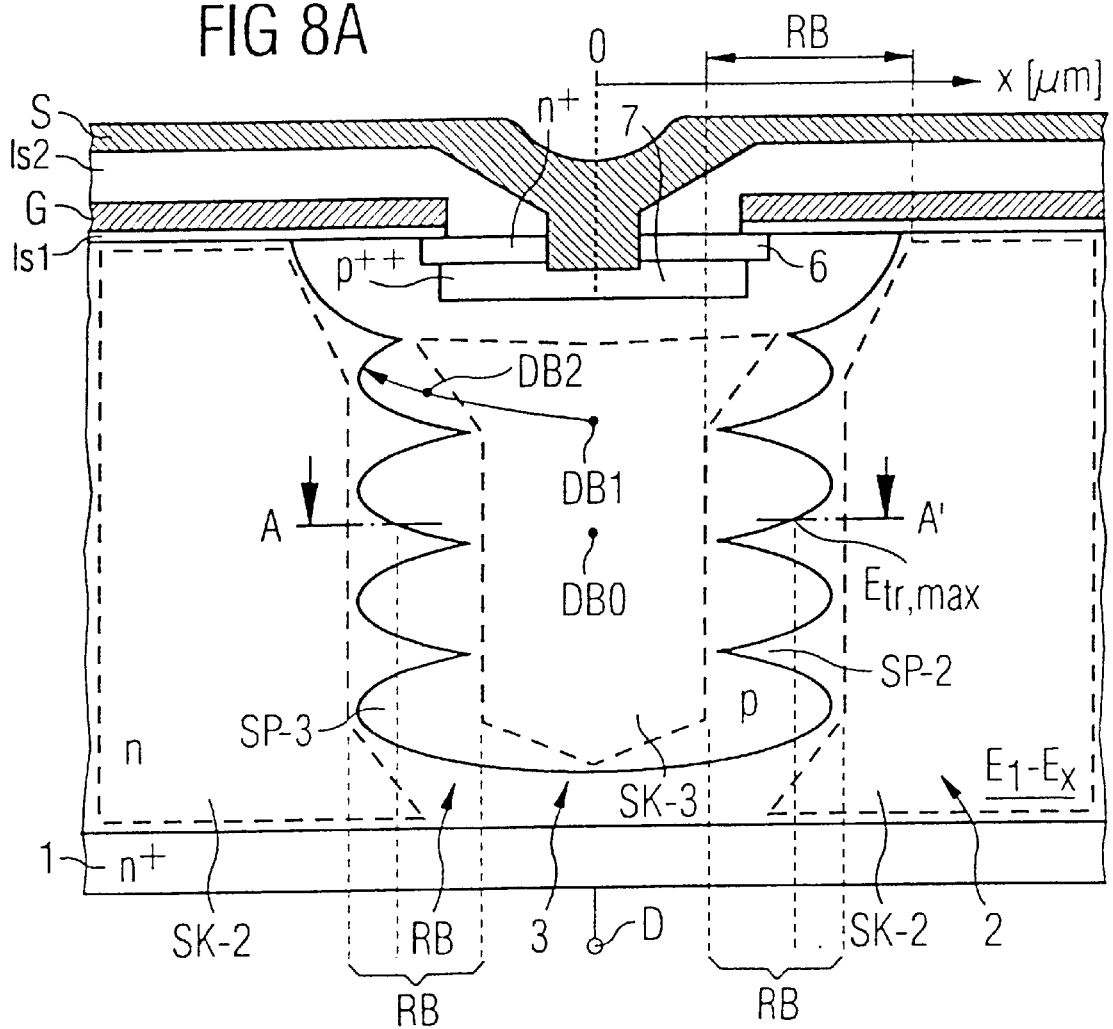
FIG. 8A is a diagrammatic partial sectional view of a semiconductor component with a charge compensation structure in accordance with a first exemplary embodiment.

FIG. 8A shows a simplified partial sectional view of a semiconductor component with a charge compensation structure in accordance with a first exemplary embodiment, identical reference symbols designating layers identical or corresponding to those in FIG. 1 and a repeated description being dispensed with below.

In accordance with FIG. 8A, once again a plurality of for example epitaxially formed semiconductor layers E1 to Ex are situated on a for example n⁺-doped carrier substrate 1 for the purpose of forming the first compensation regions 2. The second compensation region 3 formed in the semiconductor substrate therefore again has an essentially pillar-type structure with a certain doping ripple which is essentially produced from the semiconductor layers E1 to Ex.

For activating or driving the first and second compensation regions 2 and 3, once again a zone 7 forming the blocking pn junction and a first zone 6 of the opposite conductivity type are formed at the surface, which are connected to the first electrode layer or source electrode S. By contrast, the second zone 1 is connected to a second electrode D (drain), as a result of which a MOS transistor with high breakdown voltages results together with the gate layer G formed at the surface, the underlying first insulating layer Is1 and the source electrode layer S.

In accordance with FIG. 8A, in this case SK-2 designates a pillar core of the first compensation region 2 and SK-3 designates a pillar core of the second compensation region 3. This designates the volume inside the respective compensation region which is produced by rectilinear connection of the horizontal taperings or constrictions in the pillar in accordance with FIG. 8A. An outer area of the pillar cores of the first and second compensation regions thus practically represents the envelope area or envelope of a respective doping profile within a compensation region and thus designates to a first approximation the volume which prescribes the hole or electron current in the drift volume.

In accordance with FIG. 8A, regions which, although they are to be assigned to a pillar by way of the doping, nonetheless do not belong to the pillar core, that is to say lie outside the pillar cores SK-2 and SK-3, are designated as pillar periphery SP-3 of the second compensation region and as pillar periphery SP-2 of the first compensation region 2. Together these pillar peripheries SP-2 and SP-3 define a compensation edge region RB of the charge compensation structure.

In order to improve the on resistance without influencing the breakdown voltage or the susceptibility to TRAPATT oscillations which essentially result from the specific current path and an associated electric field profile, the first and second compensation regions are now doped, or their dopant concentration is raised, in such a way that locations DB2 with maximum local field strength $E_{max}$ are located within the compensation edge region RB.

Figure 8B:
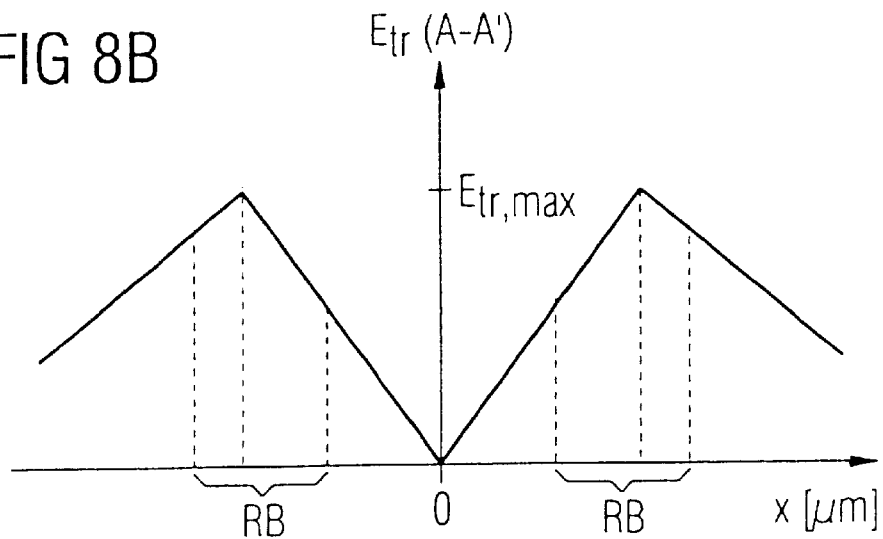
FIG. 8B is a transverse field strength profile for the component of FIG. 8A illustrated in the compensation direction.

FIG. 8B shows the ratios with regard to the transverse electric field, as are present for a compensation device.

Such a shifting or displacement of the locations with maximum local field strength into the compensation edge region is obtained in particular when a ratio $V = E_{tr,max}/E_{v,max}$ of the lateral local maximum field strength $E_{tr,max}$ and the vertical local maximum field strength $E_{v,max} > 1$. Accordingly, this condition is met to a first approximation when the lateral field strength $E_{tr,max}$ is greater than the vertical field strength $E_{v,max}$.

In order to able to effectively reduce the occurrence of the TRAPATT oscillations or to improve the on resistance without impairing the breakdown voltage and the robustness with respect to TRAPATT oscillations, such a setting of the ratio V can be applied at least to the compensation zones 4, which crucially define the secondary ionization. These are, in accordance with FIG. 8A, by way of example, the compensation zones lying in a region near the surface. By virtue of the measure proposed, the field strength maxima, whose effect would greatly influence the charge carrier generation rates in the event of a breakdown, are located in the compensation edge regions RB, where a current density in the breakdown or avalanche situation is always very small since, on account of the lateral field strength $E_{tr}$, the holes or electrons are diverted away from the compensation edge region RB in the direction of the pillar core SK-2 and SK-3 of the first and second compensation regions. Due to the above described equation for defining the impact ionization $I_s$, the secondary ionization therefore also assumes very small values, as a result of which the robustness with respect to TRAPATT oscillations is not influenced by the compensation edge region RB despite a high electric field (and hence a small on resistance/high breakdown voltage).

The effectiveness of the measure proposed is greater in this case, the further away the locations with maximum local field strength are from the respective pillar cores, that is to say the greater the ratio $V = E_{tr,max}/E_{v,max}$.

In accordance with FIG. 8A, a location DB1 with maximum local field strength migrates, as the ratio V increases, away from the pillar center in the direction toward the location DB2 and beyond, until it is located in the pn junction between the first and second compensation regions 2 and 3. While a very high secondary ionization still results for a semiconductor component for a given breakdown voltage/on resistance with a field peak in the location DB1, so-called TRAPATT oscillations can already be significantly reduced if the electric field is reduced in the location DB1 and, as a countermove, the field peak lies in the location DB2 or preferably in the edge region. It goes without saying that the effect for reducing TRAPATT oscillations is significantly improved if as many of the compensation zones as possible are designed with such a dopant concentration. In particular, it is advantageous to displace or shift a breakdown location DBO, which is characterized by a global field strength maximum, into the compensation edge region since a current density of the secondary ionization (for a given ionization rate) is also kept small in this way. By way of example, it is possible in this way to arrive at a symmetrization of a hole path to an electron path.

Figure 9A:
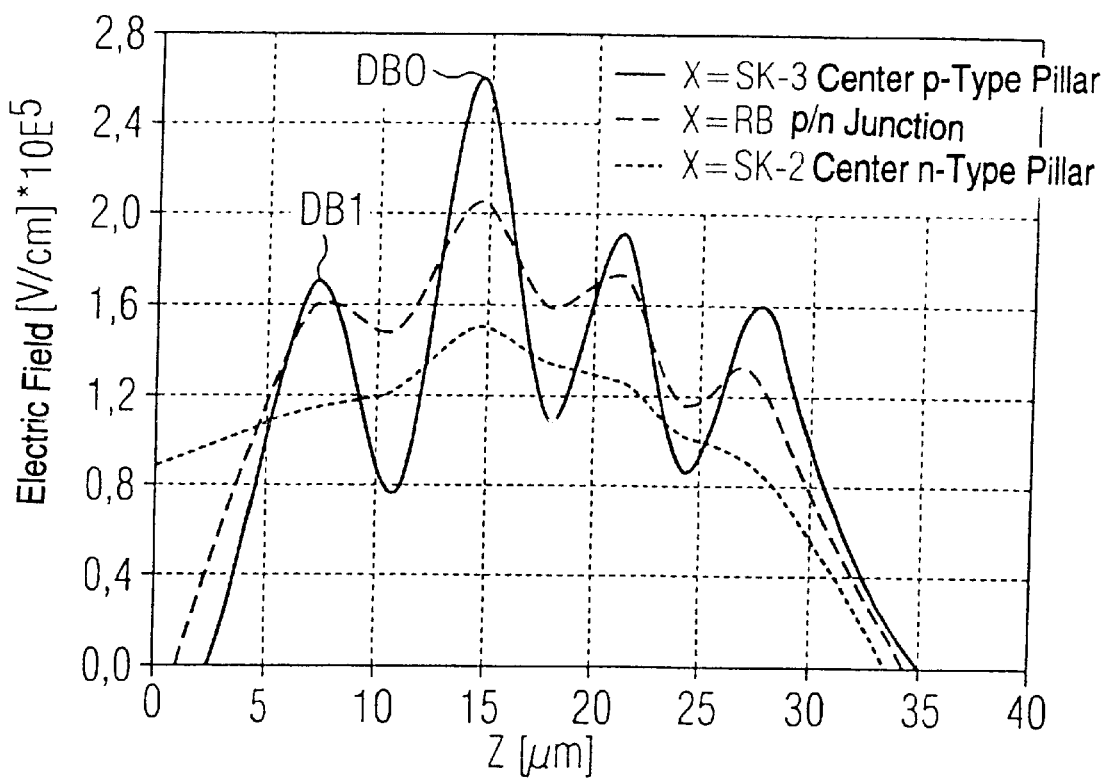
FIG. 9A is a simplified graphical representation of a depth-resolved field strength profile according to the prior art.
Figure 9B:
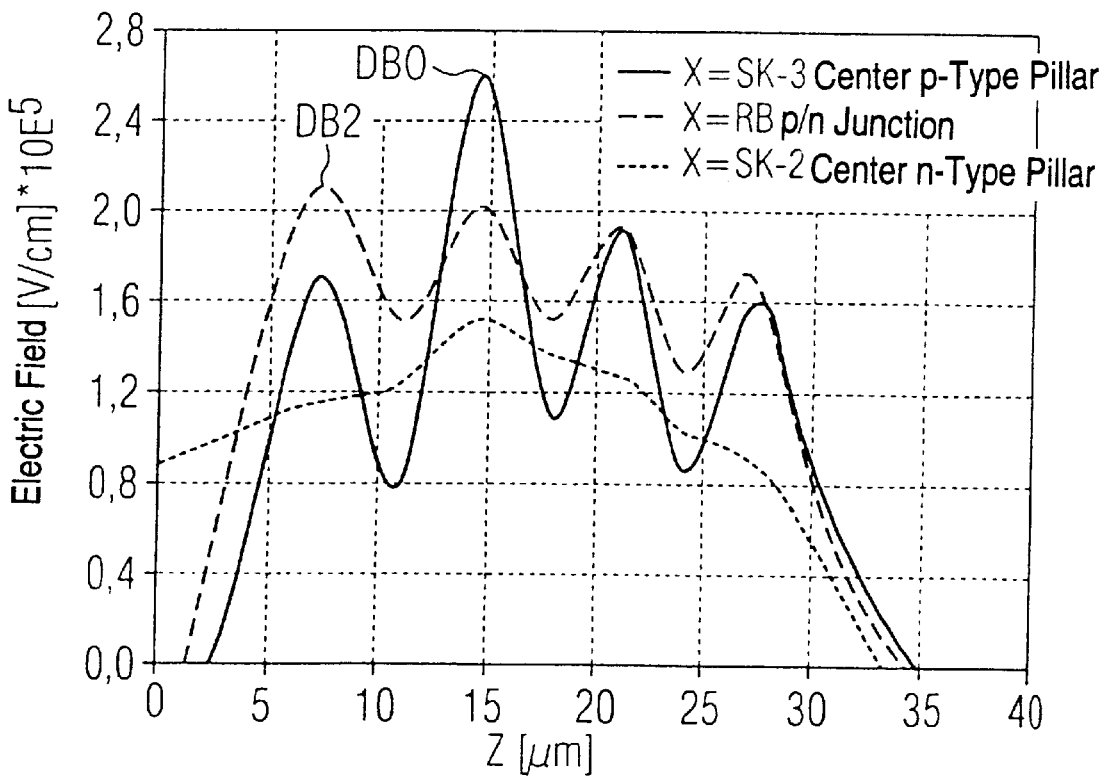
FIG. 9B is a simplified graphical representations of a depth-resolved field strength profile according to the invention.

FIGS. 9A and 9B show a simplified graphical representation of a conventional and invention-conforming depth-resolved field strength profile.

While in a conventional semiconductor component the local field strength maxima are essentially situated along the center axis or in the region SK-3 (x=0), in a semiconductor component according to the invention the locations e.g. DB2 with a local field strength maximum now lie in a compensation edge region (x=RB) at least for the topmost (and the two lower) pillar regions. Although, in accordance with FIG. 9B, a global field strength maximum at the breakdown location DBO still remains in the pillar center (x=0 or SK-3) in an unchanged manner, it is already possible to substantially reduce an on resistance. In the same way, this displacement of the locations with local maximum field strength can also be applied to the breakdown location DBO (location with local and global maximum field strength), as a result of which the latter is displaced into the edge region and the robustness with respect to TRAPATT oscillations is improved.

Figure 2:
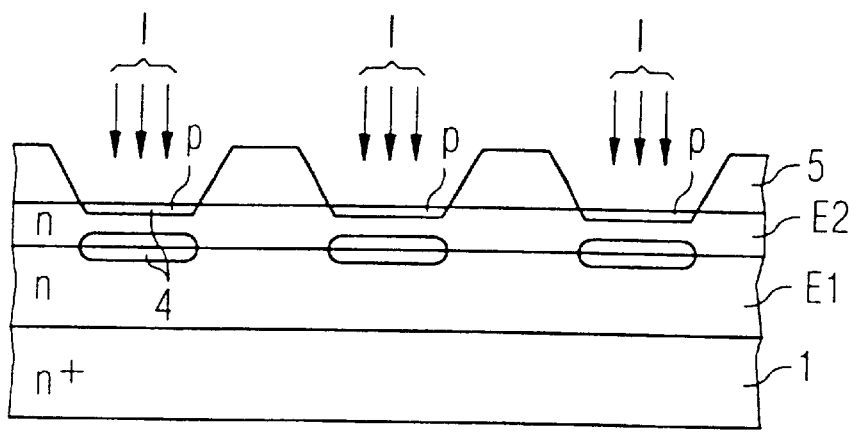
FIG. 2 is a diagrammatic sectional view for illustrating a fabrication step of the charge compensation structure in accordance with FIG. 1.
Figure 10A:
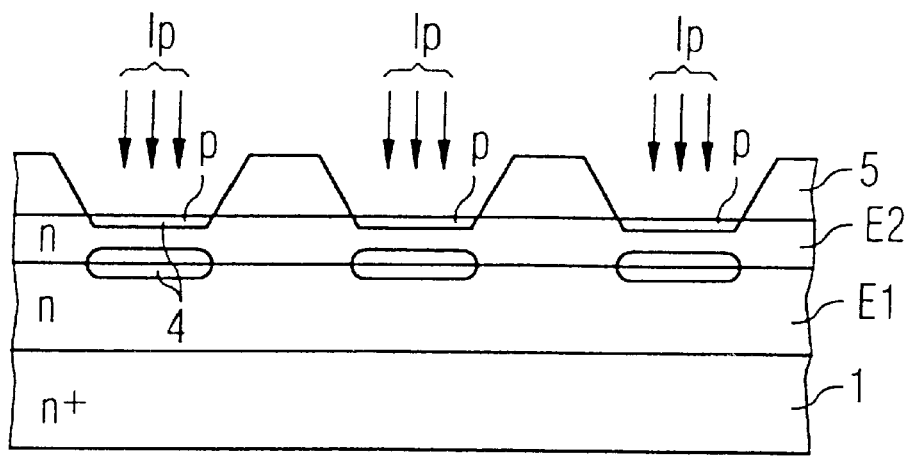
FIGS. 10A and 10B are diagrammatic sectional views for illustrating fabrication steps of the charge compensation structure in accordance with the first exemplary embodiment.
Figure 10B:
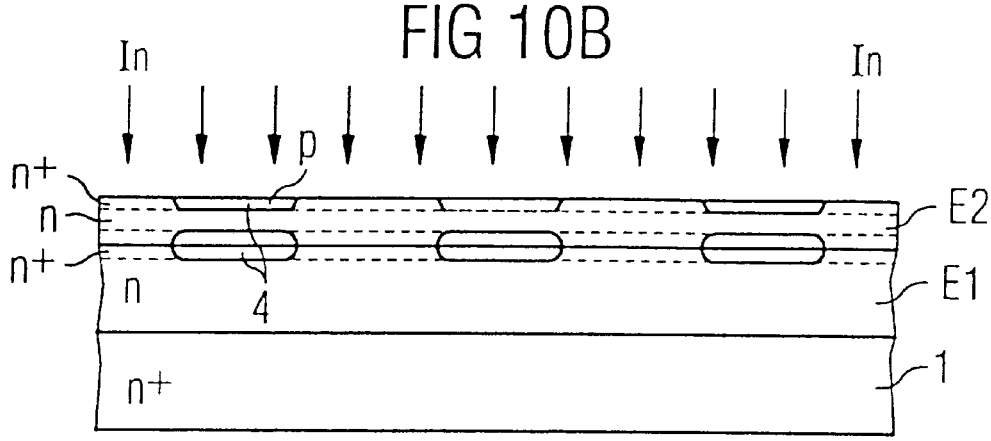

FIGS. 10A and 10B show simplified sectional views for illustrating essential fabrication steps of a semiconductor component in accordance with the first exemplary embodiment, identical reference symbols designating elements or layers identical or corresponding to those in FIG. 2 and a repeated description being dispensed with below.

In accordance with FIG. 10A, as in the case of a fabrication method for conventional semiconductor components with a charge compensation structure, firstly a first and a second semiconductor layer E1 and E2 are deposited epitaxially on a carrier substrate 1, compensation zones 4 in each case being formed using a mask 5 in a region near the surface, for example through the use of, for example, a p-doped implantation Ip.

In accordance with FIG. 10B, a whole-area, i.e. unmasked, for example n-doping implantation In is now carried out besides (i.e. after, before or at the same time as) the doping in accordance with FIG. 10A at least in individual planes or for individual compensation zones 4, as a result of which the dopant concentration and thus a ratio V can be correspondingly altered.

Dopants which diffuse essentially equally rapidly are preferably chosen for the masked and unmasked p- and n-doping implantation Ip and In, respectively. By way of example, boron can be used for the p-doping implantation and phosphorus for the n-doping implantation In. Furthermore, the energies of the two implantations In and Ip are matched such that their implantation peaks or maxima essentially lie at the same depth. Accordingly, a "counter-implantation" to the actual "compensation zone implantation" is effected. In order not to influence the charge balance and thus the compensation within the plane in this case, it is necessary, of course, to "keep" the corresponding (that is to say surface-normalized) charge quantity per cell in the compensation zone implantation (Ip). The result of such a process sequence is, with conservation of the vertical field strength $E_v$, a rise in the lateral field strength $E_{tr}$ in diverse horizontal planes and thus an advantageous displacement of the field strength maxima into the compensation edge region. The on resistance decreases on account of higher doping ratios in the conduction path (first compensation regions 2). Since the depth-resolved profile of the electric field strength is not altered, however, in the pillar center, both the breakdown voltage and, in particular, the TRAPATT robustness remain unchanged.

A particularly simple and cost-effective fabrication method is obtained in particular when an implantation is carried out. However, the invention is not restricted thereto, but rather includes, in the same way, alternative doping methods and also alternative dopants.

Figure 11:
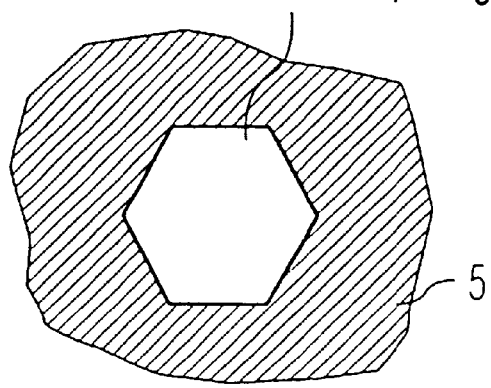
FIG. 11 is a simplified plan view of a mask used during the fabrication in accordance with FIGS. 10A and 10B.

FIG. 11 shows a simplified plan view of a mask used during the fabrication of the semiconductor component in accordance with FIG. 10A, a hexagonal form being used for a respective charge compensation cell. In the same way, however, it is also possible to use strip-type or other structures for the masking or formation of the compensation cells.

As an alternative and/or in addition to the above-described increasing of the dopant concentration, a displacement of the locations with maximum field strength into the compensation edge regions can also be carried out by a reduction of the vertical field strength $E_v$. Particularly if the vertical field strength $E_v$ tends toward zero, the ratio $V=E_{tr}/E_v$ increases to a particularly great extent, as a result of which the ensemble or the totality of the parameters including e.g. breakdown voltage/on resistance/robustness with respect to TRAPATT oscillations can be improved particularly effectively. Such a reduction of the vertical field strengths $E_v$ results, for example, from reducing a doping ripple of the second compensation region 3 and thus of the first compensation region 2.

More precisely, in a vertical direction, for example, it is possible to form an increased number of compensation zones 4 in the semiconductor substrate, thereby greatly reducing the doping ripple (=amplitudes of the field strength) and the TRAPATT oscillations. In accordance with the exemplary embodiment described above, such a reduced doping ripple is obtained for example through the use of an increased number of epitaxial layers E1 to Ex (or smaller thickness).

Figure 12:
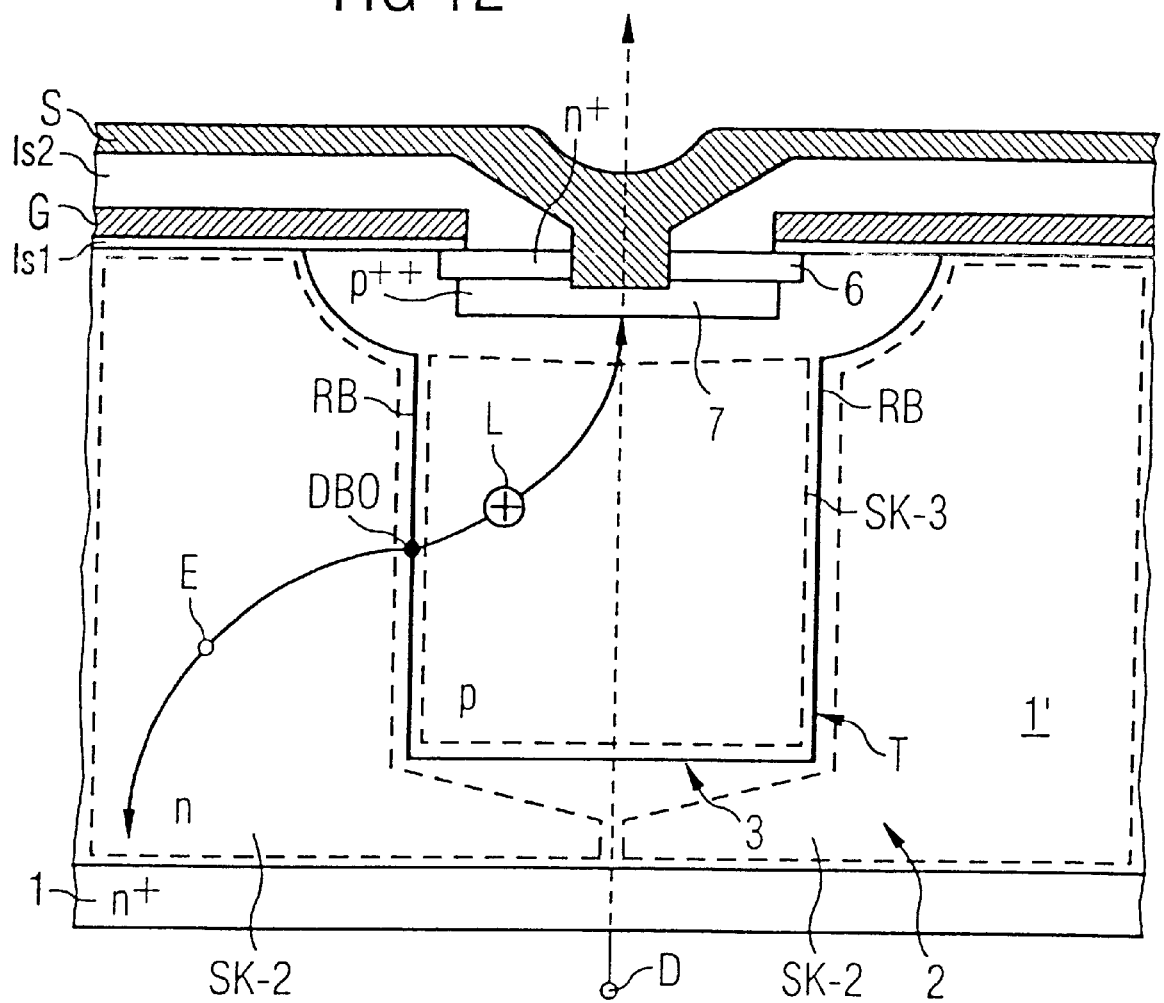
FIG. 12 is a diagrammatic partial sectional view of a semiconductor component with a charge compensation structure in accordance with a second exemplary embodiment.

FIG. 12 shows a simplified partial sectional view of a semiconductor component with a charge compensation structure in accordance with a second exemplary embodiment, identical reference symbols designating layers or elements identical or corresponding to those in FIG. 1 or 8A and a repeated description being dispensed with below.

In accordance with FIG. 12, the first and second compensation structures 2 and 3 have no doping ripple, but rather a smoothed doping profile or a cylindrical pillar. Since the vertical field strengths $E_v$ are near zero in this case, the locations of maximum local field strength are placed precisely into the edge region RB, which essentially represents the pn junction between the first compensation region 2 and the second compensation region 3.

A method for fabricating such a semiconductor component includes, for example, in the provision of a carrier substrate 1 with an associated semiconductor substrate 1' for the realization of the first compensation regions 2 and subsequent formation of a trench T in the semiconductor substrate 1'. The trench T thus formed is subsequently filled with a semiconductor material of the second conductivity type p in order to form the second compensation region 3 and then the further switching elements and layers 6, 7 and also the source electrode layer S, the gate electrode layer G and the drain electrode layer D are formed in order to provide a MOS transistor.

The formation of the trench T is preferably carried out through the use of an anisotropic etching method, particularly uniform and smooth areas and, accordingly, a much smaller doping ripple thereby being obtained.

A semiconductor component of this type yields, in the avalanche breakdown situation, a particularly exact symmetrization of the hole path L and the electron path E and also a breakdown location DBO which lies precisely in the p/n junction and in the very narrow compensation edge region RB of the charge compensation structure.

The invention has been described above using a lateral charge compensation structure. However, it is not restricted thereto and includes, in the same way, alternative charge compensation structures. In the same way, the present invention is not restricted to the above-described p- and n-type dopings in an Si semiconductor substrate, but rather relates in the same way to corresponding doping profiles and alternative semiconductor materials.

We claim:

1. A semiconductor component, comprising:
   a semiconductor substrate;
   a first electrode layer;
   a second electrode layer;
   a charge compensation structure having a blocking pn junction in said semiconductor substrate, a first zone of a first conductivity type connected to said first electrode layer, a zone of a second conductivity type opposite to said first conductivity type connected to said first electrode layer and adjoining said first zone of said first conductivity type for forming a blocking pn junction, a second zone of said first conductivity type connected to said second electrode layer, a first compensation region of said first conductivity type and a second compensation region of said second conductivity type nested into one another in a region between said first zone of said first conductivity type and said second zone of said first conductivity type;
   said first compensation region and said second compensation region forming a pn junction therebetween, said pn junction between said first compensation region and said second compensation region defining a compensation edge region; and
   said first compensation region, said second compensation region and said compensation edge region being configured such that locations with a maximum local field strength are situated in said compensation edge region.

2. The semiconductor component according to claim 1, wherein said locations with the maximum local field strength have a ratio of $E_{tr,max}/E_{v,max} > 1$, where $E_{tr,max}$ represents a lateral local maximum field strength and $E_{v,max}$ represents a vertical local maximum field strength.

3. The semiconductor component according to claim 1, wherein said first and second compensation regions have given dopant concentrations selected such that a lateral field strength is increased without changing a charge compensation capability.

4. The semiconductor component according to claim 1, wherein said first and second compensation regions have a given doping ripple selected such that the doping ripple is reduced in order to reduce a vertical field strength.

5. The semiconductor component according to claim 1, wherein said second compensation region has an increased number of compensation zones in a vertical direction for reducing a doping ripple.

6. The semiconductor component according to claim 1, wherein said semiconductor substrate has an increased number of epitaxial layers for reducing a doping ripple.

7. The semiconductor component according to claim 1, wherein said charge compensation structure has a shape selected from the group consisting of a hexagonal shape and a strip shape when viewed in a plan view.

8. The semiconductor component according to claim 1, wherein said semiconductor substrate, said charge compensation structure, and said first and second electrode layers form a compensation component.

9. A method for fabricating a semiconductor component, the method which comprises:
   providing the semiconductor component according to claim 1 by performing the following steps:
   a) providing a carrier substrate;
   b) forming a plurality of semiconductor layers in order to realize the first compensation region;
   c) carrying out a masked doping at least in a part of the semiconductor layers in order to form compensation zones and in order to realize the second compensation region nested in the first compensation region;
   d) carrying out an unmasked doping with a conductivity type opposite to a conductivity type of the masked doping, in at least one of the semiconductor layers, in order to shift the locations with the maximum local field strength into the compensation edge region; and
   e) forming elements and layers for driving the first and second compensation regions.

10. The method according to claim 9, which comprises introducing dopants diffusing substantially equally rapidly in steps c) and d).

11. The method according to claim 9, which comprises carrying out an implantation in steps c) and d).

12. The method according to claim 11, which comprises selecting a respective implantation energy in steps c) and d) such that implantation maxima of introduced dopants lie substantially at a same depth.

13. The method according to claim 9, which comprises introducing boron as a dopant in step c) and introducing phosphorus as a dopant in step d).

14. A method for fabricating a semiconductor component, the method which comprises:
   providing the semiconductor component according to claim 1 by performing the following steps:
   a) providing a carrier substrate of the first conductivity type in order to realize the first compensation region;
   b) forming a trench in the carrier substrate;
   c) filling the trench with a semiconductor material of the second conductivity type in order to form the second compensation region; and
   d) forming elements and layers which drive the first and second compensation regions.

15. The method according to claim 14, which comprises forming the trench by using an anisotropic etching method.

* * * * *